United States Patent
Takahashi et al.

(10) Patent No.: US 9,484,091 B2
(45) Date of Patent: Nov. 1, 2016

(54) RESISTANCE CHANGE MEMORY

(71) Applicants: Masahiro Takahashi, Seongnam-si (KR); Akira Katayama, Seoul (KR); Dong Keun Kim, Icheon-si (KR); Byoung Chan Oh, Seoul (KR)

(72) Inventors: Masahiro Takahashi, Seongnam-si (KR); Akira Katayama, Seoul (KR); Dong Keun Kim, Icheon-si (KR); Byoung Chan Oh, Seoul (KR)

(73) Assignees: KABUSHIKI KAISHA TOSHIBA, Tokyo (JP); SK HYNIX INC., Icheon-Si, Gyeonggi-Do (KR)

( * ) Notice: Subject to any disclaimer, the term of this patent is extended or adjusted under 35 U.S.C. 154(b) by 0 days.

(21) Appl. No.: 14/636,740

(22) Filed: Mar. 3, 2015

(65) Prior Publication Data

US 2015/0179252 A1   Jun. 25, 2015

Related U.S. Application Data

(62) Division of application No. 14/018,242, filed on Sep. 4, 2013, now Pat. No. 9,001,559.

(60) Provisional application No. 61/804,557, filed on Mar. 22, 2013.

(51) Int. Cl.
*G11C 11/16* (2006.01)
*G11C 13/00* (2006.01)

(52) U.S. Cl.
CPC ......... *G11C 13/004* (2013.01); *G11C 13/0026* (2013.01); *G11C 13/0061* (2013.01); *G11C 11/1673* (2013.01); *G11C 13/00* (2013.01);

(Continued)

(58) Field of Classification Search
CPC .. G11C 11/1673; G11C 13/00; G11C 13/004
USPC ...................... 365/163, 148, 210.1
See application file for complete search history.

(56) References Cited

U.S. PATENT DOCUMENTS

| 8,644,056 B2 | 2/2014 | Oh |
| 8,842,467 B2 | 9/2014 | Oh |
| 2003/0031046 A1 | 2/2003 | Hidaka |

(Continued)

FOREIGN PATENT DOCUMENTS

| JP | 2003059257 A | 2/2003 |
| JP | 2003-317467 A | 11/2003 |

(Continued)

OTHER PUBLICATIONS

International Search Report including Written Opinion dated Apr. 22, 2014 in International Application No. PCT/JP2014/05026.

(Continued)

*Primary Examiner* — Jason Lappas
(74) *Attorney, Agent, or Firm* — Holtz, Holtz & Volek PC

(57) ABSTRACT

According to one embodiment, a resistance change memory includes a memory cell, a sense amplifier and a global bit line. The memory cell is disposed at a location where a local bit line and a word line intersect each other. The memory cell is connected to both the local bit line and the word line. The sense amplifier reads data stored on the memory cell by supplying a read current to the memory cell. The global bit line is connected between the local bit line and the sense amplifier. The global bit line feeds the read current supplied by the sense amplifier to the local bit line. The sense amplifier charges the global bit line, before the local bit line and the global bit line are connected to each other.

5 Claims, 9 Drawing Sheets

(52) U.S. Cl.
CPC ............ *G11C 2013/0045* (2013.01); *G11C 2013/0054* (2013.01); *G11C 2213/79* (2013.01)

(56) References Cited

U.S. PATENT DOCUMENTS

| | | |
|---|---|---|
| 2003/0206473 A1 | 11/2003 | Tran |
| 2005/0024935 A1 | 2/2005 | Tanizaki et al. |
| 2005/0030814 A1 | 2/2005 | Oh et al. |
| 2006/0158922 A1 | 7/2006 | Takemura |
| 2008/0112216 A1 | 5/2008 | Ueda |
| 2009/0027952 A1* | 1/2009 | Kang ............... G11C 11/5678 365/163 |
| 2009/0225594 A1 | 9/2009 | Choi et al. |
| 2009/0323396 A1 | 12/2009 | Inaba |
| 2010/0054020 A1 | 3/2010 | Ueda |
| 2010/0195415 A1 | 8/2010 | Seko |
| 2012/0051114 A1 | 3/2012 | Lee et al. |
| 2012/0287730 A1 | 11/2012 | Kim |

FOREIGN PATENT DOCUMENTS

| | | |
|---|---|---|
| JP | 2005093044 A | 4/2005 |
| JP | 2006-179158 A | 7/2006 |
| JP | 2010061743 A | 3/2010 |
| JP | 2010-182353 A | 8/2010 |
| JP | 2012133857 A | 7/2012 |

OTHER PUBLICATIONS

Taiwanese Office Action (and English translation thereof) dated Nov. 3, 2015, issued in counterpart Taiwanese Application No. 103108562.

Japanese Office Action dated Sep. 13, 2016 issued in counterpart Japanese Application No. 2016-503913.

* cited by examiner

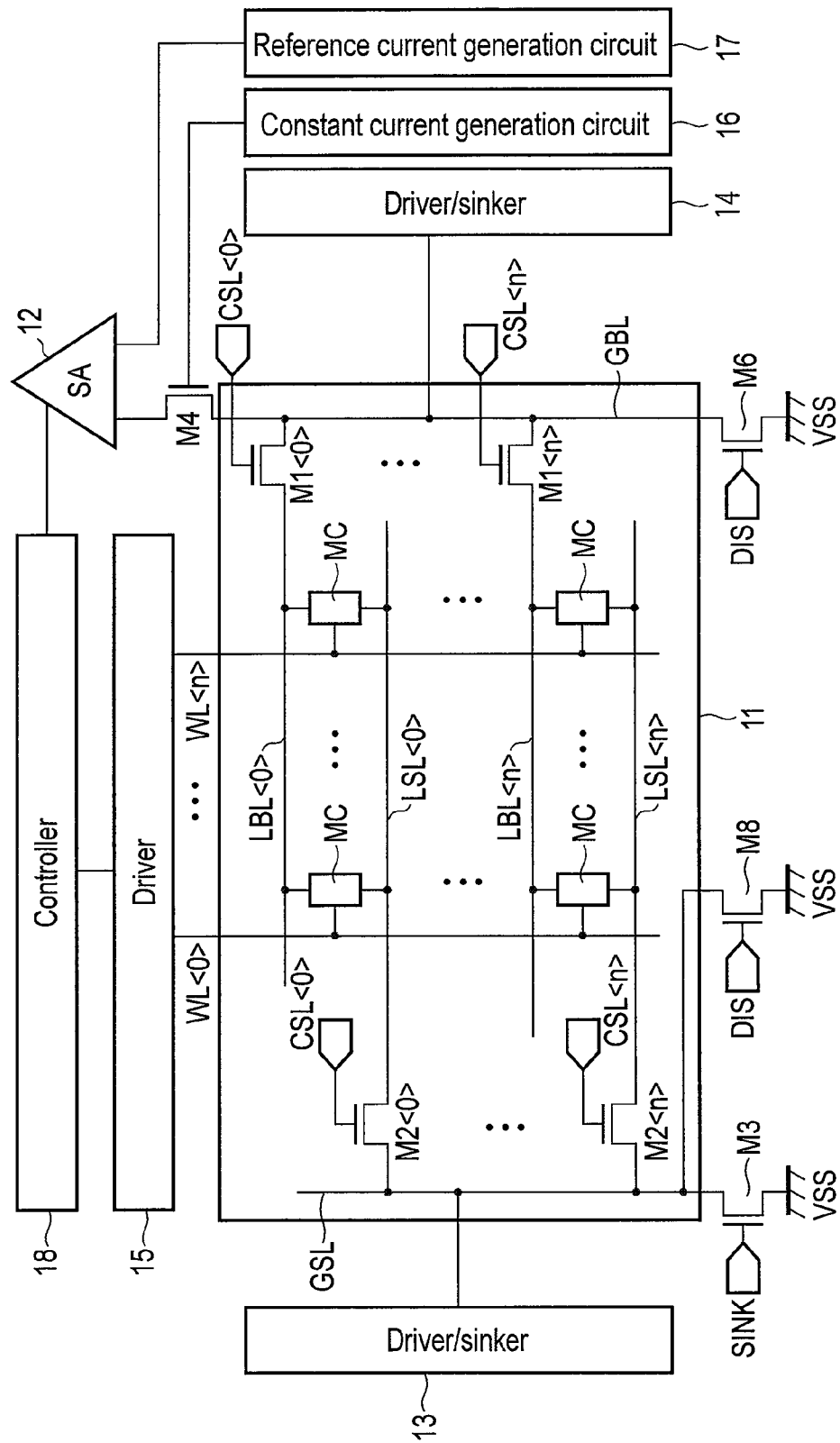
F I G. 1

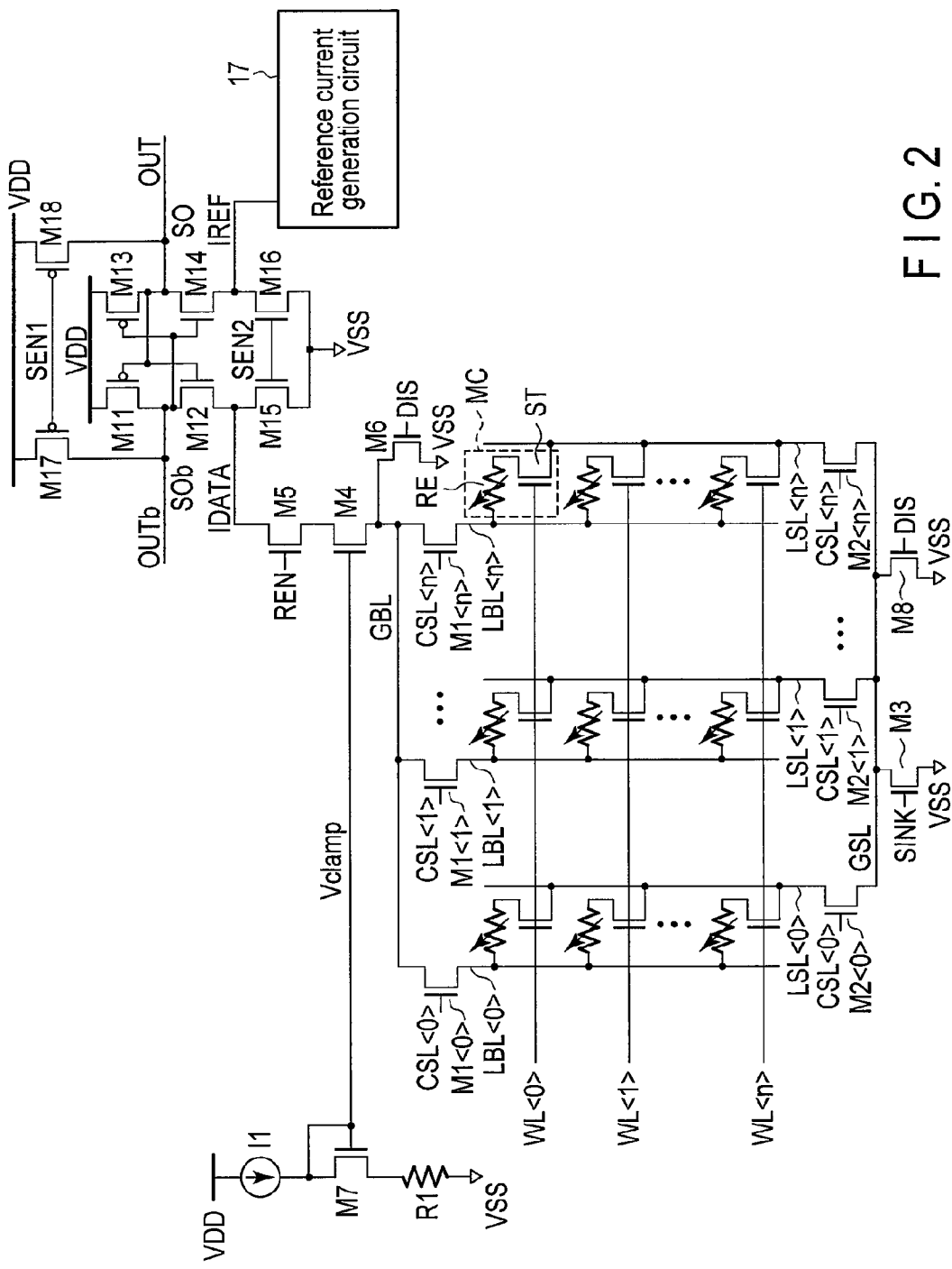
F I G. 2

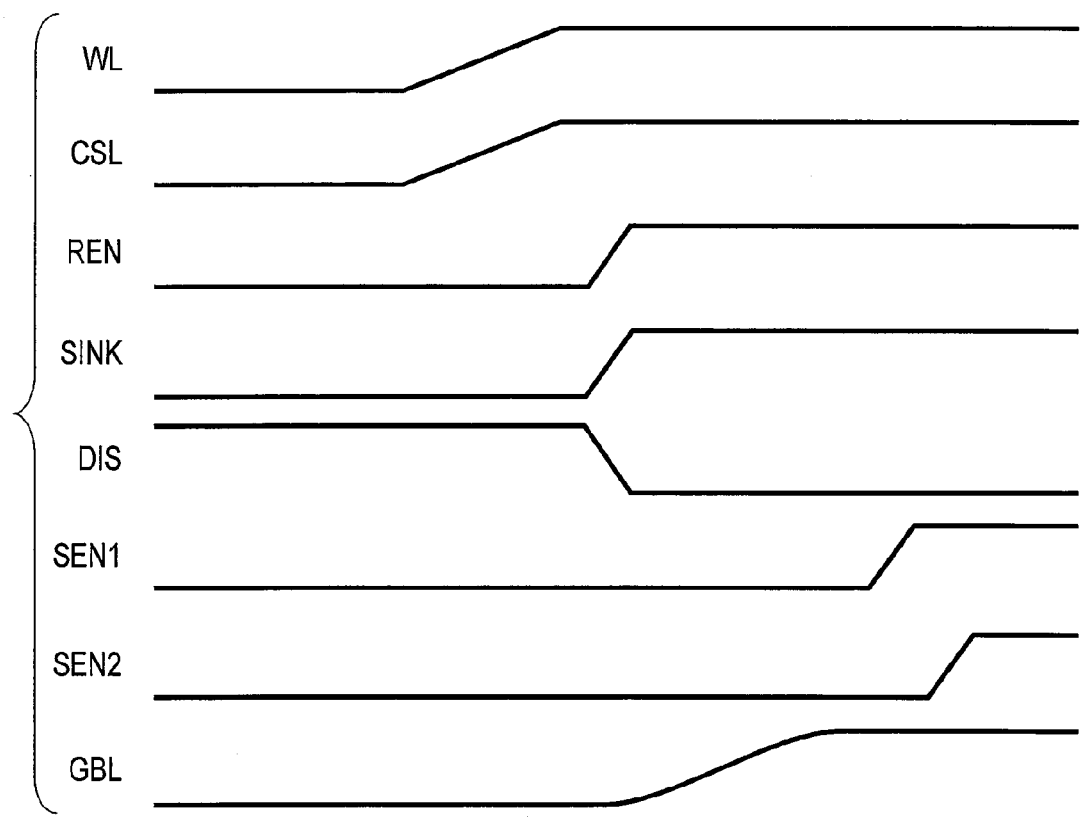
F I G. 4

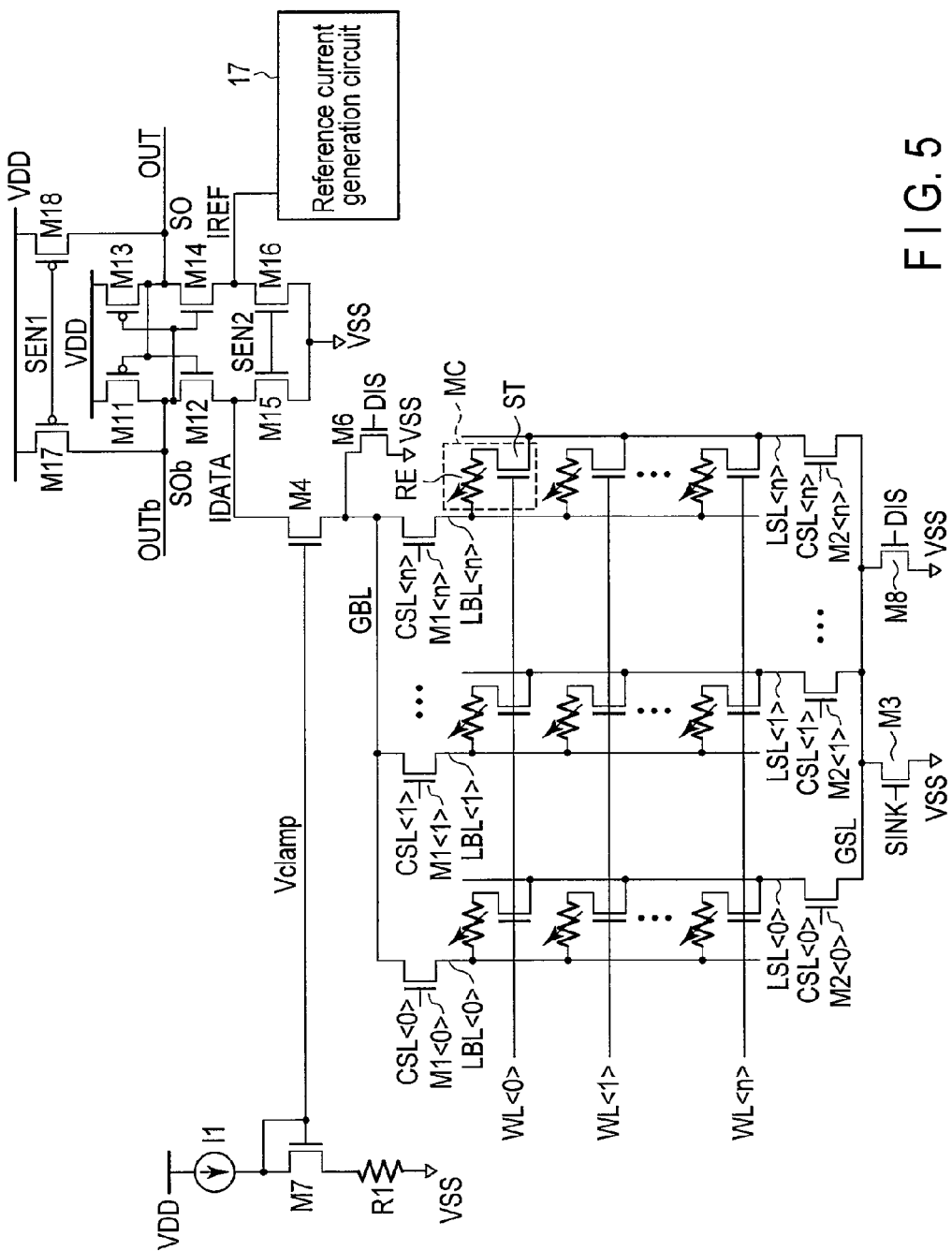
F I G. 5

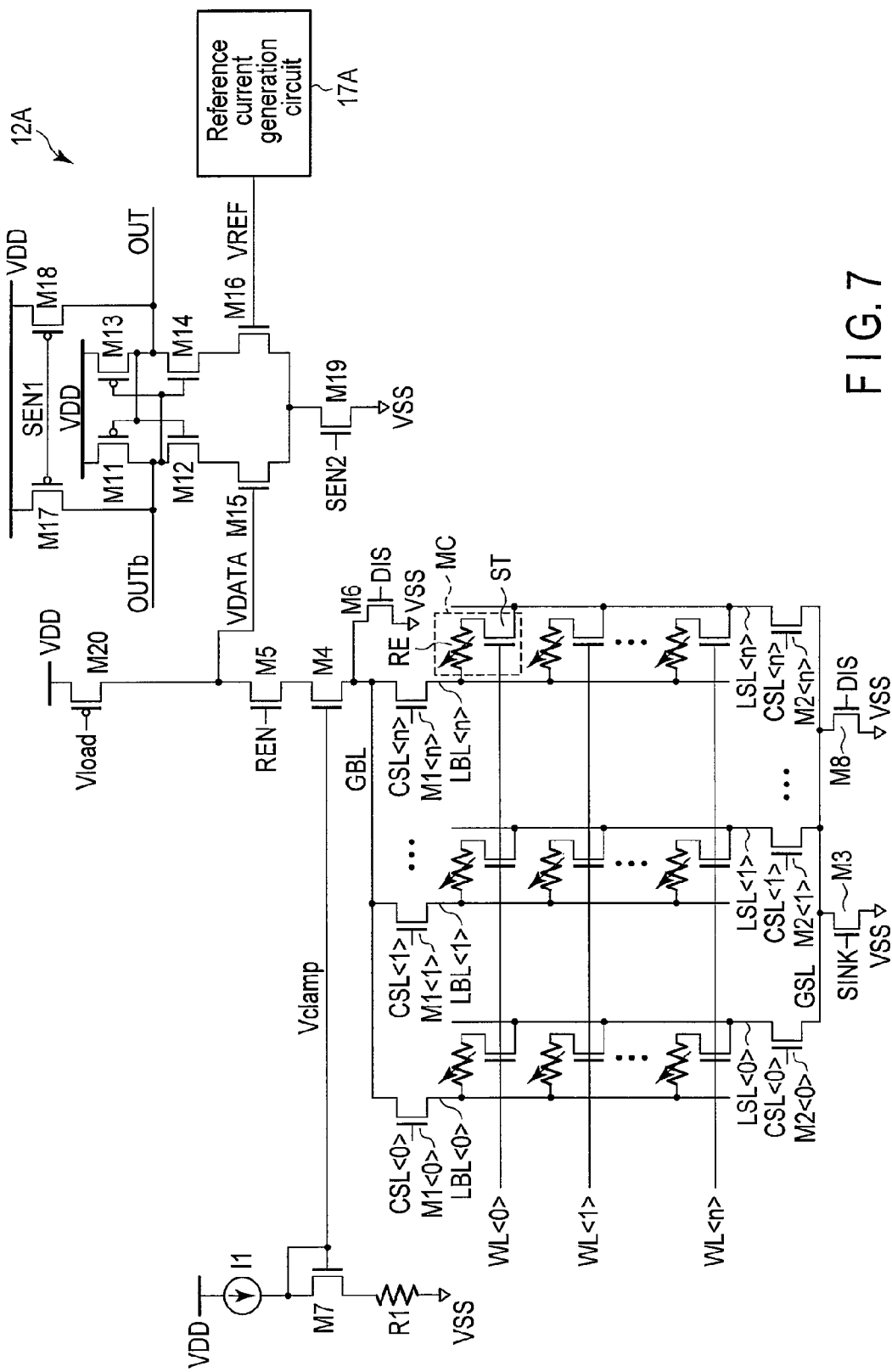
F I G. 7

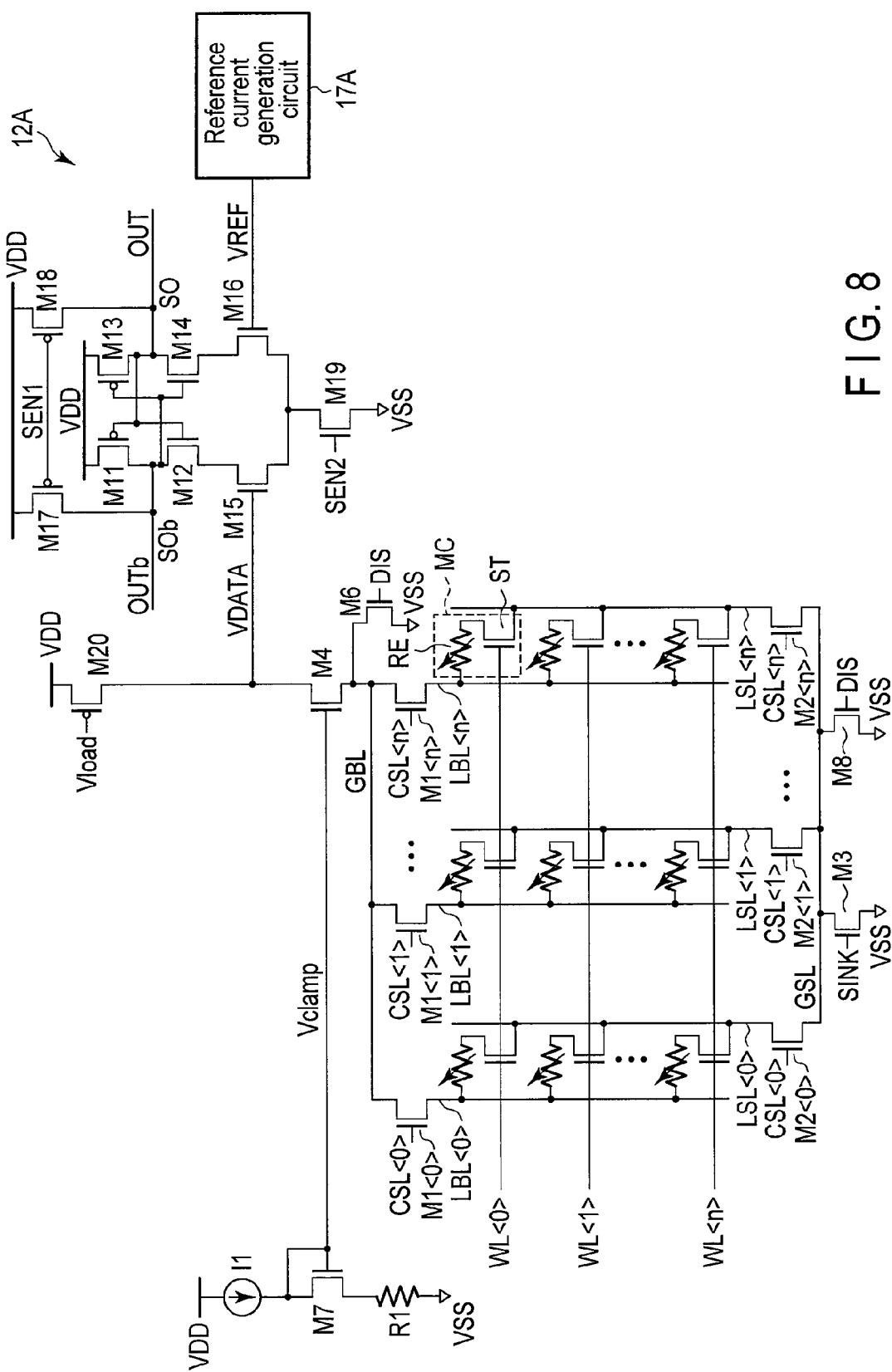
F I G. 8

US 9,484,091 B2

RESISTANCE CHANGE MEMORY

CROSS-REFERENCE TO RELATED APPLICATIONS

This is a Divisional of U.S. Ser. No. 14/018,242, filed Sep. 4, 2013, which claims the benefit of U.S. Provisional Application No. 61/804,557, filed Mar. 22, 2013, the entire contents of which are incorporated herein by reference.

FIELD

Embodiments described herein relate generally to a resistance change memory.

BACKGROUND

Recently, semiconductor memories have attracted attention, which include a nonvolatile memory, such as a resistance change memory (e.g., magnetoresistive random access memory (MRAM), phase change random access memory (PRAM), resistive random access memory (ReRAM), etc.) as a memory device.

A typical resistance change memory is configured to differentiate between data "1" and data "0" by changing its resistance through the supply of a current (or the application of a voltage). In addition, a resistance change memory is equipped with a sense amplifier that senses a slight variation in a read current from each memory cell.

BRIEF DESCRIPTION OF THE DRAWINGS

FIG. 1 is a view illustrating a configuration of a resistance change memory according to a first embodiment;

FIG. 2 is a circuit diagram of a main constituent part of the resistance change memory;

FIG. 4 is an exemplary timing chart of a read operation performed by a resistance change memory as a comparative example;

FIG. 5 is a circuit diagram of a main constituent part of a resistance change memory according to a second embodiment;

FIG. 7 is a circuit diagram of a main constituent part of a resistance change memory according to a third embodiment;

FIG. 8 is a circuit diagram of a main constituent part of a resistance change memory according to a fourth embodiment.

DETAILED DESCRIPTION

Figure 3:
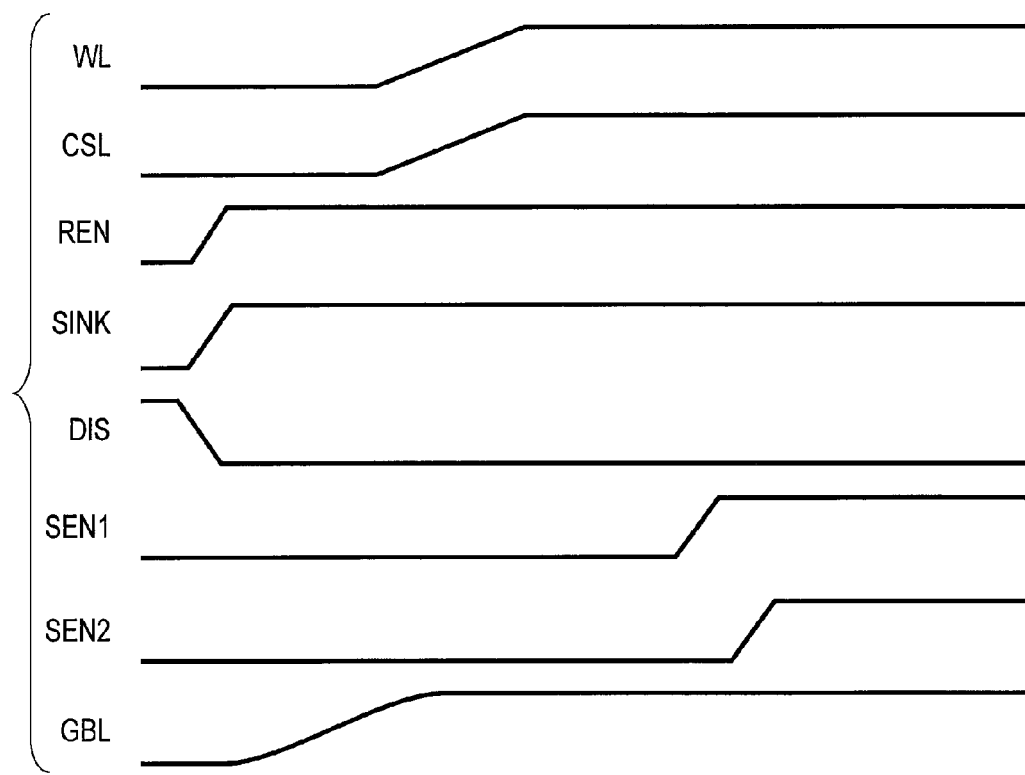
FIG. 3 is a timing chart of a read operation performed by the resistance change memory.

Hereinafter, a resistance change memory according to embodiments will be described, with reference to the accompanying drawings. In the following description, the same reference numerals are given to components having the same function and configuration, and an overlapping description will be given only when needed.

In general, according to one embodiment, a resistance change memory includes a first memory cell, a word line, a first bit line, first and second inverters, and first, second, third, fourth, fifth and sixth MOS transistors. The first memory cell has a resistance change element. The word line is connected to the first memory cell, and is driven based on an address signal. The first bit line is connected to the first memory cell while intersecting the word line, and is selected based on the address signal. The first inverter has a first input terminal, a first output terminal, and first and second voltage terminals. The second inverter has a second input terminal, a second output terminal, and third and fourth voltage terminals. The second input terminal is connected to the first output terminal, and the second output terminal is connected to the first input terminal. The first MOS transistor is connected to the first output terminal. The second MOS transistor is connected to the second output terminal. The third MOS transistor is connected to the first voltage terminal. The fourth MOS transistor is connected to the third voltage terminal. One end of a current path of the fifth MOS transistor is connected to the first voltage terminal. A first signal is supplied to a gate of the fifth MOS transistor. A second bit line is connected to another end of the current path of the fifth MOS transistor. The sixth MOS transistor is connected between the first and second bit lines. A second signal is supplied to a gate of the sixth MOS transistor. Before the sixth MOS transistor is turned on by the second signal, the fifth transistor is turned on by the first signal.

First Embodiment

FIG. 1 is a view illustrating a configuration of a resistance change memory according to a first embodiment.

The resistance change memory includes a memory cell array 11, a sense amplifier 12, drivers/sinkers 13 and 14, a driver 15, a constant current generation circuit 16, a reference current generation circuit 17, and a controller 18.

The memory cell array 11 has a plurality of memory cells MC arrayed in a matrix fashion. The memory cells MC are connected between a local bit line LBL<0> and a local source line LSL<0>, between a local bit line LBL<1> and a local source line LSL<1>, . . . and between a local bit line LBL<n> and a local source line LSL<n>, respectively. Furthermore, the memory cells are connected to word lines WL<0> to WL<n>, respectively. In other words, the memory cells MC are arranged at locations where the word lines WL<0> to WL<n> intersect both the local bit lines LBL<0> to LBL<n> and the local source lines LSL<0> to LSL<n>, respectively. It should be noted that n represents 0, 1, 2, . . . or n.

Ones of the local bit lines LBL<0> to LBL<n> are connected to a global bit line GBL through N-channel MOS field-effect transistors (hereinafter, referred to as nMOS transistors) M1<0> to M1<n>, respectively. Column selection signals CSL<0> to CSL<n> are supplied to the gates of the nMOS transistors M1<0> to M1<n>, respectively. The other end of each of the local bit lines LBL<0> to LBL<n> is connected to the plurality of memory cells MC.

The global bit line GBL is connected to the driver/sinker 14. Furthermore, the global bit line GBL is connected to the sense amplifier 12 through an nMOS transistor M4. The gate of the nMOS transistor M4 is connected to the constant current generation circuit 16 for generating a constant current. The global bit line GBL is connected to a reference voltage terminal, such as a ground potential terminal Vss, through an nMOS transistor M6. A discharge signal DIS is supplied to the gate of the nMOS transistor M6.

One ends of the local source lines LSL<0> to LSL<n> are connected to a global source line GSL through nMOS transistors M2<0> to M2<n>, respectively. The column selection signals CSL<0> to CSL<n> are supplied to the gates of the nMOS transistors M2<0> to M2<n>, respectively. The other end of each of the local source lines LSL<0> to LSL<n> is connected to the plurality of memory cells MC.

The global source line GSL is connected to the driver/sinker 13. Furthermore, the global source line GSL is connected to a reference voltage end, such as the ground potential terminal Vss, through an nMOS transistor M3. A signal SINK is supplied to the gate of the nMOS transistor M3. Furthermore, the global source line GSL is connected to a reference voltage terminal, such as the ground potential terminal Vss, through the nMOS transistor M8. A discharge signal DIS is supplied to the gate of the nMOS transistor M8.

The drivers/sinkers 13 and 14 feed a write current to each memory cell MC in a direction according to date to be written, during a write operation. In this way, the drivers/sinkers 13 and 14 write date into each memory cell MC.

The word lines WL<0> to WL<n> are connected to the driver 15 for driving the word lines WL<0> to WL<n>.

The gate of the nMOS transistor M4 is connected to the constant current generation circuit 16 for generating a constant current. The sense amplifier 12 is connected to the reference current generation circuit 17 for supplying a reference current to the sense amplifier 12. Furthermore, the controller 18 is connected to both the driver 15 and the sense amplifier 12. The controller 18 controls the operations performed by individual parts of the above resistance change memory. For example, the controller 18 generates a control signal to be supplied to the sense amplifier 12, and controls a read operation performed by the sense amplifier 12.

FIG. 2 is a circuit diagram of a configuration of the memory cell array 11, the sense amplifier 12 and the constant current generation circuit 16 in FIG. 1.

Hereinafter, a configuration of the memory cell array 11 will be described.

The memory cell array 11 has the plurality of memory cells MC arranged in a matrix fashion at the locations where the word lines WL<0> to WL<n> intersect both the local bit lines LBL<0> to LBL<n> and the local source lines LSL<0> to LSL<n>, respectively, as described above. It should be noted that n represents 0, 1, 2, . . . or n.

Each memory cell MC includes, for example, a resistance change element RE and a selection transistor ST. The resistance change element RE is an element that is configured to change its resistance through the supply of a current or the application of a voltage. Examples of the resistance change element RE include, but are not limited to, a magnetic tunnel junction (MTJ) element, a variable resistive element, a phase change element, and a ferro-electric element. The gate of the selection transistor ST is connected to the word line WL. The selection transistor ST is turned on by the word line WL, whereby the memory cell MC is selected.

Ones of the local bit lines LBL<0> to LBL<n> are connected to the global bit line GBL through the column selection transistors M1<0> to M1<n>, respectively. The column selection signals CSL<0> to CSL<n> are supplied to the gates of the column selection transistors M1<0> to M1<n>, respectively.

The global bit line GBL is connected to a connection node between nMOS transistors M12 and M15 in the sense amplifier 12 through a clamp transistor M4 and a transfer transistor M5, both current paths of which are connected in series to each other. Furthermore, the global bit line GBL is connected to the reference voltage terminal, such as the ground potential terminal Vss, through the discharge transistor M6. The discharge signal DIS is supplied to the gate of the discharge transistor M6.

One ends of the local source lines LSL<0> to LSL<n> are connected to the global source line GSL through the column selection transistors M2<0> to M2<n>, respectively. The column selection signals CSL<0> to CSL<n> are supplied to the gates of the column selection transistors M2<0> to M2<n>, respectively.

The global source line GSL is connected to the reference voltage terminal, such as the ground potential terminal Vss, through the transfer transistor M3. The signal SINK is supplied to the gate of the transfer transistor M3. Furthermore, the global source line GSL is connected to the reference voltage, such as the ground potential terminal Vss, through the discharge transistor M8. The discharge signal DIS is supplied to the gate of the discharge transistor M8.

Hereinafter, a configuration of the sense amplifier 12 will be described.

The sense amplifier 12 is a current sensing type of sense amplifier. The sense amplifier 12 is provided with: a first inverter including a P-channel field-effect transistor (hereinafter, referred to as a pMOS transistor) M11 and an nMOS transistor M12; a second inverter including a pMOS transistor M13 and an nMOS transistor M14; nMOS transistors M15 and M16; and pMOS transistors M17 and M18.

The first inverter (the transistors M11 and M12) includes a first input terminal, a first output terminal, and first and second voltage terminals. The second inverter (the transistors M13 and M14) includes a second input terminal, a second output terminal, and third and fourth voltage terminals. The second input terminal is connected to the first output terminal, and the second output terminal is connected to the first input terminal.

The first output terminal of the first inverter is connected to the drain of the pMOS transistor M17, and the source of the pMOS transistor M17 is connected to a power supply voltage terminal VDD. The second output terminal of the second inverter is connected to the drain of the pMOS transistor M18, and the source of the pMOS transistor M18 is connected to the power supply voltage terminal VDD. A first sense enable signal SEN1 from the controller 18 is supplied to both gates of the nMOS transistors M17 and M18.

A first voltage terminal of the first inverter (or the source of the transistor M12) is connected to the drain of the nMOS transistor M15, and the source of the nMOS transistor M15 is connected to the ground potential terminal Vss. The third voltage terminal of the second inverter (or the source of the transistor M14) is connected to the drain of the nMOS transistor M16, and the source of the nMOS transistor M16 is connected to the ground potential terminal Vss. A second sense enable signal SEN2 from the controller 18 is supplied to both gates of the nMOS transistors M15 and M16.

The first voltage terminal of the first inverter (or the source of the transistor M12) is connected to the drain of the nMOS transistor M5. A read enable signal REN from the controller 18 is supplied to the gate of the nMOS transistor M5. The source of the nMOS transistor M5 is connected to the global bit line GBL through the nMOS transistor M4. The gate of the nMOS transistor M4 is connected to the constant current generation circuit 16.

The third voltage terminal of the second inverter (or the source of the transistor M14) is connected to the reference current generation circuit 17. The reference current generation circuit 17 is configured to supply a reference current IREF to the sense amplifier 12. Here, the reference current IREF is set to an intermediate value between respective cell currents which cause the memory cell to store "0" and "1." This reference current IREF is generated by, for example, a reference cell.

Hereinafter, a configuration of the constant current generation circuit 16 will be described.

The gate of the nMOS transistor M4 is connected to the constant current generation circuit 16. The constant current generation circuit 16 applies a clamp voltage Vclamp (for example, 0.1 to 0.6 V), which is a preset analog voltage, to the gate of the nMOS transistor M4 during a read operation. In response, a voltage at the drain of the nMOS transistor M4 is clamped constant. This constant voltage serves the purpose of limiting a current flowing through each memory cell MC so as not to exceed an upper limit, thus preventing data stored on a selected one of the memory cells MC from being damaged.

The constant current generation circuit 16 includes a constant current source I1, an nMOS transistor M7, and a resistor R1. The drain of the nMOS transistor M7 is connected to the power supply voltage terminal VDD through the constant current source I1, and connected to the gate of the nMOS transistor M7 itself. The source of the nMOS transistor M7 is connected to the ground potential terminal Vss through the resistor R1.

Next, a description will be given of a read operation performed by the resistance change memory according to the first embodiment, with reference to FIG. 3.

FIG. 3 is a timing chart of a read operation performed by the resistance change memory.

A standby state, which is assumed before a read operation is initiated, is as follows.

In the sense amplifier 12, the first sense enable signal SEN1 is "Low" in level, which causes the pMOS transistors M17 and M18 to be in an on state, and the second sense enable signal SEN2 is "Low" in level, which causes both pMOS transistors M15 and M16 to be in an off state. Moreover, the read enable signal REN is "Low" in level, which causes the nMOS transistor M5 to be in an off state. As a result, both voltage potentials at nodes SO and SOb are precharged at a potential of a supply voltage VDD, and the sense amplifier 12 assumes a standby state.

The clamp voltage Vclamp, which is a constant analog voltage, is applied to the nMOS transistor M4, and the nMOS transistor M4 is in an on state during the standby state.

In the memory cell array 11, the word line WL<n> is in an inactive state (or in a "Low" state) and the column selection signal CSL<n> is in a "Low" state, which causes the nMOS transistor M1<n> to be in an off state.

After both voltage potentials on the global bit line GBL and the global source line GSL are discharged at the grand voltage potential Vss while both discharge transistors M6 and M8 are in an on state, both discharge transistors M6 and M8 are turned off by the discharge signal DIS. The discharge transistors M6 and M8 may be optionally provided. Further, the sink transistor M3 in a turn-off state is turned on. It is preferable that the timing at which the sink transistor M3 is turned on be set before a read current flows through the memory cell MC.

In the above state, an external source inputs an active command and an address signal to the controller 18 of the resistance change memory. In response, the controller 18 generates a bank active signal for activating a bank, based on the address signal, and activates a bank to be used, by using the bank active signal.

At this time, the controller 18 sets the level of the read enable signal REN to "High" through the address signal or the bank active signal, thereby turning on the nMOS transistor M5. As a result, a current flows from the sense amplifier 12 to the global bit line GBL through the nMOS transistors M4 and M5, so that a readout route including the global bit line GBL is charged. It should be noted that the bank active signal is used in the above description, but another internal signal generated from the address signal may be used instead of the bank active signal.

In the memory cell array 11, in turn, the local bit line LBL<n> and the local source line LSL<n> are selected through the column selection signal CSL<n>. In addition, the word line WL<n> is driven, so that the memory cell MC to be read is selected. Specifically, by setting the level of the column selection signal CSL<n> to "High," the nMOS transistors M1<n> and M2<n> are turned on. As a result, the local bit line LBL<n> is connected to the global bit line GBL, and the local source line LSL<n> is connected to the global source line GSL.

Furthermore, by setting the level of the word line WL<n> to "High," the selection transistor ST is turned on. As a result, the memory cell MC to be read is selected. In this case, the nMOS transistor M3 is in an on state through the signal SINK, during the read operation. Through the above processing, a read current is fed from the sense amplifier 12 to the selected memory cell MC.

Next, by setting the level of the first sense enable signal SEN1 to "High," both pMOS transistors M17 and M18 are turned off. As a result, precharging both nodes SO and SOb is stopped. Then, the read current becomes a current supplied only from the power supply voltage terminal VDD to which both drains of the nMOS transistors M11 and M13 are connected. In this case, the read current is changed depending on data ("0" or "1") stored on the selected memory cell MC. In other words, the read current is changed depending on which of the low and high resistance states the selected memory cell MC assumes. The read current changed in this manner, namely, depending on the data of the selected memory cell MC refers to a cell current IDATA.

After that, by setting the level of the second sense enable signal SEN2 to "High," both nMOS transistors M15 and M16 are turned on. In response, the reference current IREF driven by the reference current generation circuit 17 is compared with the cell current IDATA. As a result, a level of a latch circuit including the pMOS transistors M11 and M13 and the nMOS transistors M12 and M14 is retained at a "High" or "Low" level, in accordance with the comparison result. Finally, (data in) a "High" or "Low" level which is retained in the latch circuit is output from the nodes SO and SOb as output signals OUT and OUTb, respectively.

Here, the reference current IREF is set to an intermediate value between respective cell currents which cause the memory cell to store "0" and "1." The reference current IREF may be generated by, for example, a reference memory cell.

As described above, the nMOS transistor M5 is turned on by the read enable signal REN, thereby charging the global bit line GBL in advance. Then, the memory cell MC is selected by the column selection signal CSL<n> and the word line WL<n>, and the read current is fed to the selected memory cell MC. In other words, the global bit line GBL is precharged, before the memory cell MC is selected through the column selection signal CSL<n> and then the word line WL<n> and the read current is fed to the selected memory cell MC. Consequently, it is possible to shorten a read time by a time required for charging the global bit line GBL.

In the first embodiment, after the readout route including the global bit line GBL is precharged, the read operation is performed by selecting the memory cell through the column selection signal CSL<n> and feeding the read current to the selected memory cell. This embodiment enables a time of charging the bit line, which is basically regarded as an unnecessary time and affects the read time, to be removed from an actual read time. Consequently, it is possible to shorten the read time.

Furthermore, by using the address signal or the internal signal generated from the address signal, the signal for initiating the charging of the readout route (read enable signal REN) is generated. In other words, the address signal or the internal signal generated from the address signal triggers the charging of the readout route. Accordingly, it is possible to set the timing of initiating the charging of the readout route efficiently.

Furthermore, in this embodiment, the bit lines are precharged with the current supplied from the sense amplifier, as described above. Therefore, this embodiment eliminates the need for installing an extra precharging circuit, and also avoids the increase in the area.

FIG. 4 is an exemplary timing chart of a read operation performed by a resistance change memory as a comparative example.

First, in accordance with input address information, the word line WL<n> is activated and the level of the column selection signal CSL<n> is set to "High," which turns on the nMOS transistors M1<n> and M2<n>, as illustrated in FIG. 4. Then, the level of the read enable signal REN is set to "High", which turns on the nMOS transistor M5. In this case, the nMOS transistor M3 is in an on state through the signal SINK, during a read operation.

As a result, a current is fed from the sense amplifier 12 to the global bit line GBL through the nMOS transistors M4 and M5, so that a readout route including the global bit line GBL is discharged and the read current flows through the selected memory cell MC.

In turn, both levels of the first and second sense enable signals SEN1 and SEN2 are set to "High." As a result, a level of the latch circuit is retained at a "High" or "Low" level, in accordance with data stored on the selected memory cell MC. Finally, (data in) a "High" or "Low" level which is retained in the latch circuit is output.

During the read operation as in FIG. 4, the read enable signal REN is activated, and then the capacity of the readout route (mainly, the global bit line GBL) is charged in accordance with its RC time constant. As a result, a signal appears on the readout route. However, the charging time for the readout route, as described above, does not directly contribute to the operation of reading the memory cell. If this charging time considerably extends, it may affect the reading time. In other words, the charging time may extend the reading time unnecessarily.

In contrast, in the first embodiment, the readout route is charged by activating the reading start signal (or the read enable signal REN) in advance through the address signal or the internal signal generated from the address signal. Followed by, the word line WL and the column selection signal CSL are activated, then the initializing signal (or the first sense enable signal SEN1) for the sense amplifier is inactivated, and the latch start signal (or the second sense enable signal SEN2) is activated. Finally, the read current is fed to the selected memory cell MC, and data stored on the selected memory cell MC is read.

In this embodiment, as described above, the readout route including the global bit line is precharged, and then the read current is fed to the selected memory cell, so that the read operation is initiated. This embodiment makes it possible to shorten the charging time for the readout route, thereby shortening the reading time. Furthermore, in this embodiment, the readout route including the global bit line is precharged with a current supplied from the sense amplifier, as described above. Therefore, this embodiment eliminates the need for installing an extra precharging circuit, and also avoids the increase in the area.

Second Embodiment

As for a second embodiment, a description will be given of an example of precharging a global bit line through the switching of a clamp transistor M4.

FIG. 5 is a circuit diagram of a configuration of a memory cell array 11, a sense amplifier 12, and a constant current generation circuit 16 in the second embodiment.

A resistance change memory according to the second embodiment has a circuit equivalent to that of FIG. 2 from which the transfer transistor M5 disposed between the clamp transistor M4 and the sense amplifier 12 is removed, as illustrated in FIG. 5. The remaining configuration of the resistance change memory according to the second embodiment, namely, other configurations of a memory cell array, a sense amplifier, and a constant current generation circuit are the same as those of the first embodiment as in FIGS. 1 and 2. Therefore, the descriptions thereof will be omitted.

First, a description will be given of a read operation performed by the resistance change memory according to the second embodiment, with reference to FIG. 6.

Figure 6:
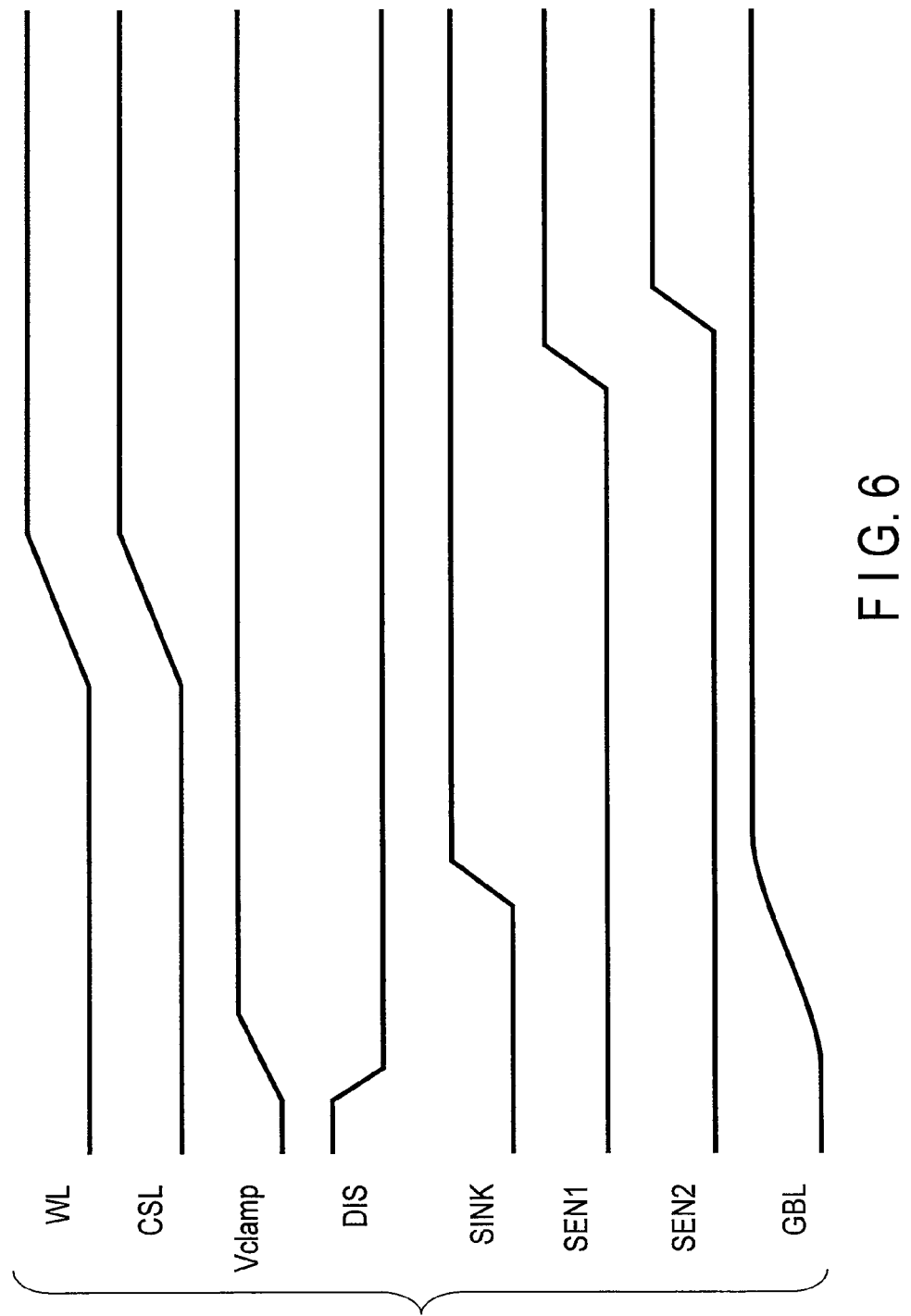
FIG. 6 is a timing chart of a read operation performed by the resistance change memory.

FIG. 6 is a timing chart of a read operation performed by the resistance change memory.

A standby state, which is assumed before a read operation is initiated, is the same as that as illustrated in FIG. 3.

In the above state, an external source inputs an active command and an address signal to a controller 18 of the resistance change memory. In response, the controller 18 generates a bank active signal for activating a bank, based on the address signal, and activates a bank to be used, through the bank active signal.

In the above case, the address signal or the bank active signal triggers the application of a clamp voltage Vclamp to the gate of the nMOS transistor M4. When the clamp voltage Vclamp reaches a predetermined level, the nMOS transistor M4 is turned on. As a result, a current flows from a sense amplifier 12 to a global bit line GBL through the nMOS transistor M4, so that a readout route including the global bit line GBL is charged. It should be noted that the bank active signal is used in the above description, but another internal signal generated from the address signal may be used instead of the bank active signal.

In a memory cell array 11, in turn, a local bit line LBL<n> and a local source line LSL<n> are selected through a column selection signal CSL<n>. In addition, a word line WL<n> is driven, so that a memory cell MC to be read is selected. Specifically, by setting the level of the column selection signal CSL<n> to "High," both nMOS transistors M1<n> and M2<n> are turned on. As a result, the local bit line LBL<n> is connected to the global bit line GBL, and the local source line LSL<n> is connected to a global source line GSL. Furthermore, by setting the level of the word line WL<n> to "High," a selection transistor ST is turned on. As a result, the memory cell MC to be read is selected. In this case, an nMOS transistor M3 is in an on state through a signal SINK, during the read operation. Through the above processing, a read current is fed from the sense amplifier 12 to the selected memory cell MC.

Next, by setting the level of a first sense enable signal SEN1 to "High," both pMOS transistors M17 and M18 are turned off. As a result, precharging both nodes SO and SOb is stopped. Then, the read current becomes a current supplied only from a power supply voltage terminal VDD to which both drains of nMOS transistors M11 and M13 are connected. In this case, the read current is changed depending on data stored on the selected memory cell MC.

After that, by setting the level of a second sense enable signal SEN2 to "High," both nMOS transistors M15 and M16 are turned on. In response, a reference current IREF driven by the reference current generation circuit 17 is compared with a cell current IDATA. As a result, a level of a latch circuit including pMOS transistors M11 and M13 and nMOS transistors M12 and M14 is retained at a "High" or "Low" level, in accordance with the comparison result. Finally, (data in) a "High" or "Low" level which is retained in the latch circuit is output from the nodes SO and SOb as output signals OUT and OUTb, respectively.

As described above, the nMOS transistor M4 is turned on by the clamp voltage Vclamp, and the global bit line GBL is charged in advance. Then, the memory cell MC is selected by the column selection signal CSL<n> and the word line WL<n>, and the read current is fed to the selected memory cell MC. In other words, the global bit line GBL is precharged, before the memory cell MC is selected through the column selection signal CSL<n> and the word line WL<n> and then the read current is fed to the selected memory cell MC. Consequently, it is possible to shorten a read time by a time required for charging the global bit line GBL.

In the second embodiment, as described above, after the readout route including the global bit line GBL is precharged, the memory cell is selected by the column selection signal CSL<n>, and the read current is fed to the selected memory cell, so that the read operation is initiated. This embodiment enables a time of charging the bit line, which is basically regarded as an unnecessary time and affects the read time, to be removed from an actual read time. Consequently, it is possible to shorten the read time.

Furthermore, by using the address signal or the internal signal generated from the address signal, the supply of a signal for specifying the upper limit of a current flowing through the selected memory cell MC (or the application of the clamp voltage Vclamp) is initiated. In other words, the address signal or the internal signal generated from the address signal triggers the charging of the readout route. Accordingly, it is possible to set the timing of initiating the charging of the readout route efficiently.

Furthermore, in this embodiment, the bit lines are precharged with the current supplied from the sense amplifier, as described above. Therefore, this embodiment eliminates the need for installing an extra precharging circuit, and also avoids the increase in the area.

Third Embodiment

In the above first and second embodiments, the resistance change memory equipped with the current sensing type of sense amplifier has been provided. Meanwhile, as for the third embodiment, a description will be given of a resistance change memory equipped with a voltage sensing type of sense amplifier.

FIG. 7 is a circuit diagram of a configuration of a memory cell array 11, a voltage sensing type of sense amplifier 12A, a constant current generation circuit 16, and a reference voltage generation circuit 17A in the third embodiment.

Hereinafter, a configuration of a memory cell array 11 will be described.

A global bit line GBL is connected to the gate of an nMOS transistor M15 in the sense amplifier 12A through an nMOS transistor (clamp transistor) M4 and an nMOS transistor (transfer transistor) M5, both current paths of which are connected in series to each other. The remaining configuration thereof is the same as that of the memory cell array as in FIG. 2.

Hereinafter, a configuration of the sense amplifier 12A will be described.

The sense amplifier 12A is a voltage sensing type of sense amplifier. The sense amplifier 12A is provided with: a first inverter including a pMOS transistor M11 and an nMOS transistor M12; a second inverter including a pMOS transistor M13 and an nMOS transistor M14; nMOS transistors M15, M16 and M19; and pMOS transistors M17, M18 and M20.

The first inverter (the transistors M11 and M12) includes a first input terminal, a first output terminal, and first and second voltage terminals. The second inverter (the transistors M13 and M14) includes a second input terminal, a second output terminal, and third and fourth voltage terminals. The second input terminal is connected to the first output terminal, and the second output terminal is connected to the first input terminal.

The first output terminal of the first inverter is connected to the drain of the pMOS transistor M17, and the source of the pMOS transistor M17 is connected to a power supply voltage terminal VDD. The second output terminal of the second inverter is connected to the drain of the pMOS transistor M18, and the source of the pMOS transistor M18 is connected to the power supply voltage terminal VDD. A first sense enable signal SEN1 from the controller 18 is supplied to both gates of the nMOS transistors M17 and M18.

The first voltage terminal of the first inverter (or the source of the transistor M12) is connected to the drain of the nMOS transistor M15. The third voltage terminal of the second inverter (or the source of the transistor M14) is connected to the drain of the nMOS transistor M16. Both sources of the nMOS transistors M15 and M16 are connected to a ground potential terminal Vss through the nMOS transistor M19. A second sense enable signal SEN2 from the controller 18 is supplied to the gate of the nMOS transistor M19.

The gate of the nMOS transistor M15 is connected to the drain of the nMOS transistor M5. A read enable signal REN from the controller 18 is supplied to the gate of the nMOS transistor M5.

The gate of the nMOS transistor M16 is connected to the reference voltage generation circuit 17A. The reference voltage generation circuit 17A applies a reference voltage VREF to the sense amplifier 12A. Here, the reference voltage VREF is set to an intermediate value between respective cell voltages which cause the memory cell to store "0" and "1." This reference voltage VREF is generated by, for example, a reference cell.

The drain of the nMOS transistor M5 is connected to the power supply voltage terminal VDD through the pMOS transistor (load transistor) M20. A load voltage Vload is applied to the gate of the pMOS transistor M20.

Hereinafter, a configuration of the constant current generation circuit 16 will be described.

The gate of the nMOS transistor M4 is connected to a constant current generation circuit 16. A configuration of the constant current generation circuit 16 is the same as that of the constant current generation circuit as in FIG. 2.

Next, a description will be given of a read operation performed by the resistance change memory according to the third embodiment.

A timing chart of a read operation performed by the resistance change memory according to the third embodiment is the same as that of FIG. 3.

In the voltage sensing type of sense amplifier 12A, a read current is changed depending on data stored on the selected memory cell MC, so that a voltage at a connection node between the nMOS transistor M5 and the pMOS transistor M20 is changed. The voltage at the connection node, which is changed in this manner, namely, depending on the data of the selected memory cell MC, refers to a cell voltage VDATA.

In response, the reference voltage VREF applied by the reference voltage generation circuit 17A is compared with the cell voltage VDATA. As a result, a level of a latch circuit including pMOS transistors M11 and M13 and nMOS transistors M12 and M14 is retained at a "High" or "Low" level, in accordance with the comparison result. Finally, (data in) a "High" or "Low" level which is retained in the latch circuit is output from nodes SO and SOb as output signals OUT and OUTb, respectively.

In the third embodiment, similar to the first embodiment, a read enable signal REN is generated by an address signal or an internal signal generated from the address signal, and the nMOS transistor M5 is turned on by this read enable signal REN. As a result, a global bit line GBL is charged in advance. Then, the memory cell MC is selected by a column selection signal CSL<n> and a word line WL<n>, and a read current is fed to the selected memory cell MC. In other words, the global bit line GBL is precharged, before the memory cell MC is selected through the column selection signal CSL<n> and the word line WL<n> and then the read current is fed to the selected memory cell MC. Consequently, it is possible to shorten a read time by a time required for charging the global bit line GBL.

In the third embodiment, as described above, after the readout route including the global bit line GBL is precharged, the memory cell is selected by the column selection signal CSL<n>, and the read current is fed to the selected memory cell, so that the read operation is initiated. Accordingly, this embodiment enables a time of charging the bit line, which is basically regarded as an unnecessary time and affects the read time, to be removed from an actual read time. Consequently, it is possible to shorten the read time. The remaining configuration thereof is the same as that of the first embodiment as described above.

Fourth Embodiment

In a fourth embodiment, a resistance change memory is equipped with a voltage sensing type of sense amplifier, similar to the third embodiment. In the fourth embodiment, a description will be given of an example of precharging a global bit line through the switching of the clamp transistor M4.

FIG. 8 is a circuit diagram of a configuration of a memory cell array 11, a voltage sensing type of sense amplifier 12A, a constant current generation circuit 16, and a reference voltage generation circuit 17A in the fourth embodiment.

The resistance change memory according to the fourth embodiment has a circuit equivalent to that of FIG. 7 from which the transfer transistor M5 disposed between the clamp transistor M4 and the load transistor M20 is removed, as illustrated in FIG. 8. The remaining configuration of the resistance change memory according to the fourth embodiment, namely, other configurations of a memory cell array, a sense amplifier, and a constant current generation circuit are the same as those of the third embodiment as illustrated in FIGS. 1 and 7. Therefore, the descriptions thereof will be omitted.

Next, a description will be given of a read operation performed by the resistance change memory according to the fourth embodiment.

A timing chart of a read operation performed by the resistance change memory according to the fourth embodiment is the same as that of FIG. 6.

In the voltage sensing type of sense amplifier 12A, a read current is changed depending on data stored on the selected memory cell MC, so that a voltage at a connection node between an nMOS transistor M4 and a pMOS transistor M20 is changed.

In response, a reference voltage VREF applied by the reference voltage generation circuit 17A is compared with a cell voltage VDATA. As a result, a level of a latch circuit including pMOS transistors M11 and M13 and nMOS transistors M12 and M14 is retained at a "High" or "Low" level, in accordance with the comparison result. Finally, (data in) a "High" or "Low" level which is retained in the latch circuit is output from nodes SO and SOb as output signals OUT and OUTb, respectively.

In the fourth embodiment, similar to the second embodiment, the application of the clamp voltage Vclamp is initiated by an address signal or an internal signal generated from the address signal, and the nMOS transistor M4 is turned on by this clamp voltage Vclamp. As a result, the global bit line GBL is charged in advance. Then, the memory cell MC is selected by a column selection signal CSL<n> and a word line WL<n>, and a read current is fed to the selected memory cell MC. In other words, the global bit line GBL is precharged, before the memory cell MC is selected through the column selection signal CSL<n> and the word line WL<n> and then the read current is fed to the selected memory cell MC. Consequently, it is possible to shorten a read time by a time required for charging the global bit line GBL.

In the fourth embodiment, as described above, after the readout route including the global bit line GBL is precharged, the memory cell is selected by the column selection signal CSL<n>, and the read current is fed to the selected memory cell, so that the read operation is initiated. This embodiment enables a time of charging the bit line, which is basically regarded as an unnecessary time and affects the read time, to be removed from an actual read time. Consequently, it is possible to shorten the read time. The remaining configuration thereof is the same as that of the first embodiment as described above.

Fifth Embodiment

A fifth embodiment provides the same circuit configuration as that of the fourth embodiment as in FIG. 8. In this embodiment, a description will be given of an example of precharging a global bit line through the switching of a load transistor M20.

A configuration of a resistance change memory according to the fifth embodiment, namely, configurations of a memory cell array, a sense amplifier, and a constant current generation circuit are the same as those of the fourth embodiment as illustrated in FIGS. 1 and 8. Therefore, the descriptions thereof will be omitted.

Next, a description will be given of a read operation performed by the resistance change memory according to the fifth embodiment, with reference to FIG. 9.

Figure 9:
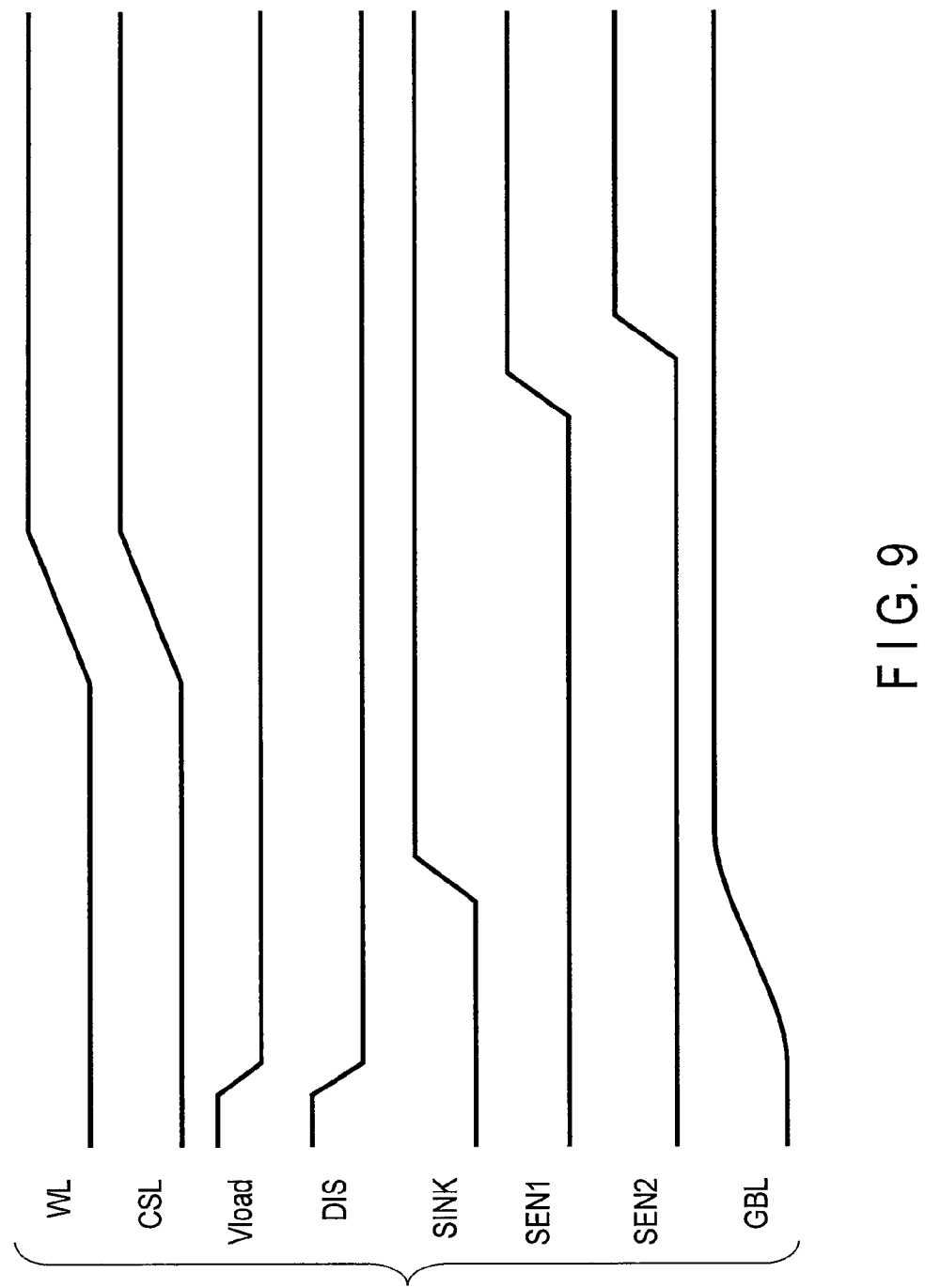
FIG. 9 is a timing chart of a read operation performed by a resistance change memory according to a fifth embodiment.

FIG. 9 is a timing chart of a read operation performed by the resistance change memory.

A standby state, which is assumed before a read operation initiated, is the same as that as illustrated in FIG. 3.

In the above state, an external source inputs an active command and an address signal to a controller 18 of the resistance change memory. In response, the controller 18 generates a bank active signal for activating a bank, based on the address signal, and activates a bank to be used, by using the bank active signal.

In this case, the address signal or the bank active signal triggers a "Low" level of the load voltage Vload, thereby turning on the pMOS transistor M20. As a result, a current flows from a power supply voltage terminal VDD to a global bit line GBL through the pMOS transistor M20 and an nMOS transistor M4 so that a readout route including the global bit line GBL is charged. It should be noted that the bank active signal is used in the above description, but another internal signal generated from the address signal may be used instead of the bank active signal.

In a memory cell array 11, in turn, a local bit line LBL<n> and a local source line LSL<n> are selected through a column selection signal CSL<n>. In addition, a word line WL<n> is driven, so that a memory cell MC to be read is selected. Specifically, by setting the level of the column selection signal CSL<n> to "High," both nMOS transistors M1<n> and M2<n> are turned on. As a result, the local bit line LBL<n> is connected to the global bit line GBL, and the local source line LSL<n> is connected to the global source line GSL. Furthermore, by setting the level of the word line WL<n> to "High," a selection transistor ST is turned on. As a result, the memory cell MC to be read is selected. In this case, an nMOS transistor M3 is in an on state through a signal SINK, during the read operation. Through the above processing, a read current is fed from a sense amplifier 12A to the selected memory cell MC.

In the voltage sensing type of sense amplifier 12A, the read current is changed depending on data stored on the selected memory cell MC, so that a voltage at a connection node between the nMOS transistor M4 and the pMOS transistor M20 is changed.

In response, a reference voltage VREF applied by the reference voltage generation circuit 17A is compared with a cell voltage VDATA. As a result, a level of a latch circuit including pMOS transistors M11 and M13 and nMOS transistors M12 and M14 is retained at a "High" or "Low" level, in accordance with the comparison result. Finally, (data in) a "High" or "Low" level which is retained in the latch circuit is output from nodes SO and SOb as output signals OUT and OUTb, respectively.

In the fifth embodiment, the load voltage Vload is generated by an address signal or an internal signal generated from the address signal, and the pMOS transistor M20 is turned on by this load voltage Vload. As a result, the global bit line GBL is charged in advance. Then, the memory cell MC is selected by the column selection signal CSL<n> and the word line WL<n>, and the read current is fed to the selected memory cell MC. In other words, the global bit line GBL is precharged, before the memory cell MC is selected through the column selection signal CSL<n> and the word line WL<n> and then the read current is fed to the selected memory cell MC. Consequently, it is possible to shorten a read time by a time required for charging the global bit line GBL.

In the fifth embodiment, as described above, after the readout route including the global bit line GBL is precharged, the memory cell is selected by the column selection signal CSL<n>, and the read current is fed to the selected memory cell, so that the read operation is initiated. Accordingly, this embodiment enables a time of charging the bit line, which is basically regarded as an unnecessary time and affects the read time, to be removed from an actual read time. Consequently, it is possible to shorten the read time. The remaining configuration thereof is the same as that of the first embodiment as described above.

Effect

The above embodiments are applicable to semiconductor memories into which data is written with a current, including MRAMs having magnetoresistive effect elements, ReRAMs having variable resistive elements, and PRAMS having phase change elements.

For example, an MRAM includes a magnetic resistive element called a magnetic tunnel junction (MTJ) element, as a memory element. Such an MTJ element includes a fixed layer (or a reference layer), a recording layer (or a free layer), and an insulating layer that is sandwiched therebetween. In the fixed layer, a magnetization direction is fixed by an antiferromagnetic layer, and in the recording layer, a magnetization direction can be inverted freely. The MTJ element utilizes the change in the resistance in the recording layer in the magnetization direction, relative to the resistance of the fixed layer, which is called a magnetoresistive effect. Thus, the MTJ element differentiates between data "1" and data "0" by utilizing a relative difference between respective resistances in the magnetization direction.

A mechanism for writing data into an MRAM, such as a spin injection type of MRAM, operates as follows. When data "1" is written into the MRAM, a current is fed thereto in a direction from the fixed layer to the recording layer of the MTJ element. Meanwhile, when data "0" is written into the MRAM, a current is fed thereto in a direction from the recording layer to the fixed layer of the MTJ element.

In the embodiments, as described above, the readout route (mainly, the global bit line) is precharged by the address signal or the internal signal generated from the address signal, before the column selection signal or the word line is activated. This is followed by initiation of the read operation. Accordingly, these embodiments enable a time of charging the readout route, which is basically regarded as an unnecessary time and affects the read time, to be removed from an actual read time. Consequently, it is possible to shorten the read time during which the memory cell array is activated and data is read therefrom.

Furthermore, in accordance with the address signal or the internal signal generated from the address signal, the signal for initiating the charging of the readout route is generated. In other words, the address signal or the internal signal generated from the address signal triggers the charging of the readout route. Accordingly, it is possible to set the timing of initiating the charging of the readout route efficiently.

Furthermore, in the above embodiments, the bit lines are precharged with the current supplied from the sense amplifier, as described above. Therefore, these embodiments eliminate the need for installing an extra precharging circuit, and also avoid the increase in the area.

The overall configuration of the resistance change memory according to each embodiment, namely, the configurations of the memory cell array, memory cells, sense amplifier, drivers/sinkers, constant current generation circuit, reference current generation circuit, and the like are not limited to those of the above examples. For example, the structure disclosed by U.S. Pat. No. 7,649,792 or US 2012/0286339 may be employed. The contents of these specifications are entirely incorporated herein by reference.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A resistance change memory comprising:
a memory cell disposed at a location where a local bit line and a word line intersect each other, the memory cell having a resistance change element, and the memory cell being connected to both the local bit line and the word line;
a sense amplifier that reads data stored on the memory cell by supplying a read current to the memory cell; and
a global bit line connected between the local bit line and the sense amplifier, the global bit line feeding the read current supplied by the sense amplifier to the local bit line,
wherein the sense amplifier charges the global bit line, before the local bit line and the global bit line are connected to each other, in response to a read enable signal being received at a gate of a transfer transistor electrically connected between the memory cell and the sense amplifier, and
wherein the global bit line is charged by activating the read enable signal.

2. The resistance change memory according to claim 1, wherein the sense amplifier initiates the charging of the global bit line in response to one of (i) an active command, (ii) an address signal that designates the local bit line and the word line or a region containing the local bit line and the word line, and (iii) a signal generated from the address signal.

3. The resistance change memory according to claim 1, wherein the local bit line is coupled to the global bit line by activating a column selection signal.

4. The resistance change memory according to claim 1, wherein the transfer transistor is directly connected to an inverter of the sense amplifier.

5. The resistance change memory according to claim 1, wherein a current of the transfer transistor flows between an inverter of the sense amplifier and the global bit line.

* * * * *